United States Patent
Nam et al.

(10) Patent No.: US 6,597,614 B2
(45) Date of Patent: Jul. 22, 2003

(54) SELF REFRESH CIRCUIT FOR SEMICONDUCTOR MEMORY DEVICE

(75) Inventors: Jong Ki Nam, Kyoungki-do (KR); Jong Doo Joo, Kyoungki-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 09/892,550

(22) Filed: Jun. 28, 2001

(65) Prior Publication Data

US 2002/0018387 A1 Feb. 14, 2002

(30) Foreign Application Priority Data

Jun. 30, 2000 (KR) .......................................... 2000-36896

(51) Int. Cl.$^7$ ................................................. G11C 7/04
(52) U.S. Cl. ........................ 365/222; 365/211; 331/66; 331/176
(58) Field of Search ................................ 365/222, 227, 365/211; 331/57, 66, 176

(56) References Cited

U.S. PATENT DOCUMENTS 5,600,281 A * 2/1997 Mori et al. ................. 331/57
5,694,090 A * 12/1997 Morgan ...................... 331/57
6,281,760 B1 * 8/2001 Koelling et al. ............. 331/66

* cited by examiner

Primary Examiner—Son Mai
(74) Attorney, Agent, or Firm—Pillsbury Winthrop LLP

(57) ABSTRACT

A self refresh circuit for a semiconductor memory device can reduce power consumption by varying a self refresh period according to a data holding time of a cell varied by a temperature. The self refresh circuit includes a temperature sensing unit for sensing a temperature, and generating a bias current for adjusting a self refresh period according to a data holding time of a memory cell varied by the temperature, and a ring oscillator unit for generating a pulse signal having a period actively varied according to the temperature by the bias current from the temperature sensing unit.

4 Claims, 5 Drawing Sheets

SELF REFRESH CIRCUIT FOR SEMICONDUCTOR MEMORY DEVICE

BACKGROUND OF THE INVENTION

1. Field of the Invention

The present invention relates to a self refresh circuit for a semiconductor memory device, and in particular to an improved self refresh circuit for a semiconductor memory device which can reduce power consumption by varying a self refresh period according to a data holding time of a cell which is a function of temperature.

2. General Background and Related Art

In general, a DRAM cell consists of an NMOS transistor serving as a switch and a capacitor for storing electric charges which represent data. For example, binary information 0 or 1 can be represented by the terminal voltage of the capacitor. A high terminal voltage could represent a 1 and a low terminal voltage could represent a 0 or the opposite could be the case. A so-called "write" operation occurs when a voltage corresponding to the binary information is applied to the memory cell. A so-called "read" operation occurs when the existence or absence of a capacitor charge is determined by sensing terminal voltage of the capacitor and providing a signal indicative thereof.

Generally speaking, holding data in the cell should not require consumption of power because the capacitor is merely storing a charge. However, a charge being held by a capacitor gradually reduces due to a leakage current through the PN junction of the MOS transistor, and thus the data will eventually be lost unless it is refreshed. To refresh the data, it is necessary to read the data in the memory cell and then re-charge the capacitor accordingly. This refresh operation must be periodically repeated to prevent data from degenerating. The refresh period required is related to the process and structure of the capacitor. The data is maintained according to a dynamic process, such as a repeated refresh operation.

The refresh operation is performed by enabling a word line according to a row address, and enabling a sense amplifier (hereinafter "sense amp"). In addition, the refresh operating may be carried out by operating the sense amp, without receiving refresh address. I this case, the refresh address counter embedded in a DRAM chip, generates a row address.

"Refresh" operations can be further categorized as "auto-refresh" and "self refresh". An auto-refresh operation occurs when, during operation of the chip, there is periodically generated and received a refresh command. During this auto-refresh, other commands to the chip are intercepted, refresh is carried out, and then the chip is allowed to receive and act on the other commands. For self-refresh there is established a regular periodic reading of cell data and re-writing that data in order to prevent a data loss even when the chip is operating in a so-called standby mode. An internal timer controls the frequency of self-refresh.

Self refresh is used for low power operation of the chip and to store data for an extended period of time. In self refresh operation, when entire banks are in an idle state, a chip selection signal /CS, a RAS bar signal /RAS, a CAS bar signal /CAS and a clock enable signal CKE are low, and a write enable signal /WE is high, thereby initiating self refresh mode operation. Once the self refresh mode is enabled, all input pins except for a clock enable pin are ignored.

In order to stop the self refresh operation, when a clock buffer is operated by receiving a clock signal clk and converting the clock enable signal CKE to a high level, the SDRAM is in the idle state after a predetermined time $t_{RC}$. At this time, other commands can be input.

FIG. 1 (Prior Art) is a block diagram illustrating a conventional self refresh circuit. The conventional self refresh circuit includes a self-refresh command decoder 10, a self refresh generating unit 20, a ring oscillator unit 30, a frequency driver unit 40, a self refresh request circuit unit 50, a RAS generating unit 60 and a predecoder unit 70.

Firstly, when an output signal from self refresh command decoder 10 is input to the self refresh generating unit 20, the self refresh generating unit 20 outputs a signal srefz for enabling the self refresh mode to the ring oscillator unit 30. According to convention, the signal srefz is enabled when it is high.

The ring oscillator unit 30 outputs a pulse signal toggled in a period of 1 $\mu$s to the frequency driver unit 40 according to the signal srefz from the self refresh generating unit 20. The frequency driver unit 40 receives the pulse signal from the ring oscillator unit 30, and generates a pulse signal having a double period. Here, the pulse signal is a refresh time request signal output to the self refresh request unit 50.

The self refresh request unit 50 selects and outputs a refresh period signal (generally 8 $\mu$s, 16 $\mu$s) suitable for a data holding time and a refresh cycle of the DRAM cell in accordance with the refresh time request signal from the frequency driver unit 40. The RAS generating unit 60 generates the RAS signal according to the refresh period signal from the self refresh request unit 50. The predecoder unit 70 is operated according to the RAS signal.

Although not illustrated, a decoder circuit and a word line driving circuit are operated by the predecoder unit 70, thereby performing the self refresh operation.

FIG. 2 (Prior Art) is a graph showing variations of a required self refresh period as a function of temperature. When temperature increases, the required self refresh period is reduced. Conversely, when temperature decreases, the required self refresh period is increased. Since the data holding time of the DRAM cell varies according to temperature, the self refresh period is inversely proportional to temperature. In general, when the temperature increases by 10° C., the data holding time of the cell is reduced into a half.

However, the conventional self refresh circuit is designed to have a predetermined self refresh period, without being able to adjust for variations of the data holding time of the DRAM cell which fluctuate with temperature. That is, the conventional self refresh circuit is designed to have a constant self refresh period based on presumed worst conditions, which results in increased power consumption.

SUMMARY

Accordingly, the claimed inventions feature, at least in part, a self refresh circuit for a semiconductor memory device which can reduce power consumption by varying a self refresh period according to a data holding time of a cell that is a function of temperature.

There is provided a self refresh circuit for a semiconductor memory device, including a temperature sensing unit for sensing a temperature, and generating a bias current for adjusting a self refresh period according to a data holding time of a memory cell that is a function of temperature. A ring oscillator unit generates a pulse signal having a period actively varied according to the temperature by the bias current from the temperature sensing unit.

The temperature sensing unit includes a first reference voltage generating unit for generating a reference voltage that is inversely proportional to temperature variations. A second reference voltage generating unit receives the output signal from the first reference voltage generating unit, and generates a reference voltage that is proportional to temperature variations. A third reference voltage generating unit receives the output signal from the second reference voltage generating unit, and generates a current for controlling the operation of the ring oscillator unit. The operation of the ring oscillator unit is controlled according to the output signals from the second and third reference voltage generating units.

The first reference voltage generating unit includes a PMOS transistor connected between a power supply voltage node and an output terminal in a diode structure. Two NMOS transistors are connected in series between the output terminal and a ground voltage node in a diode structure.

The second reference voltage generating unit includes a PMOS transistor connected between the power supply voltage node and an output terminal in a diode structure. An NMOS transistor is connected between the output terminal and the ground voltage node, and has its gate connected to receive the output signal from the first reference voltage generating unit.

The third reference voltage generating unit includes a PMOS transistor connected between the power supply voltage node and an output terminal in a diode structure. An NMOS transistor is connected between the output terminal and the ground voltage node, and has its gate connected to receive the output signal from the second reference voltage generating unit.

BRIEF DESCRIPTION OF THE DRAWINGS

The present invention will become better understood with reference to the accompanying drawings which are provided only by way of illustration and thus are not limitative of the present invention, wherein.

DETAILED DESCRIPTION

Figure 1:
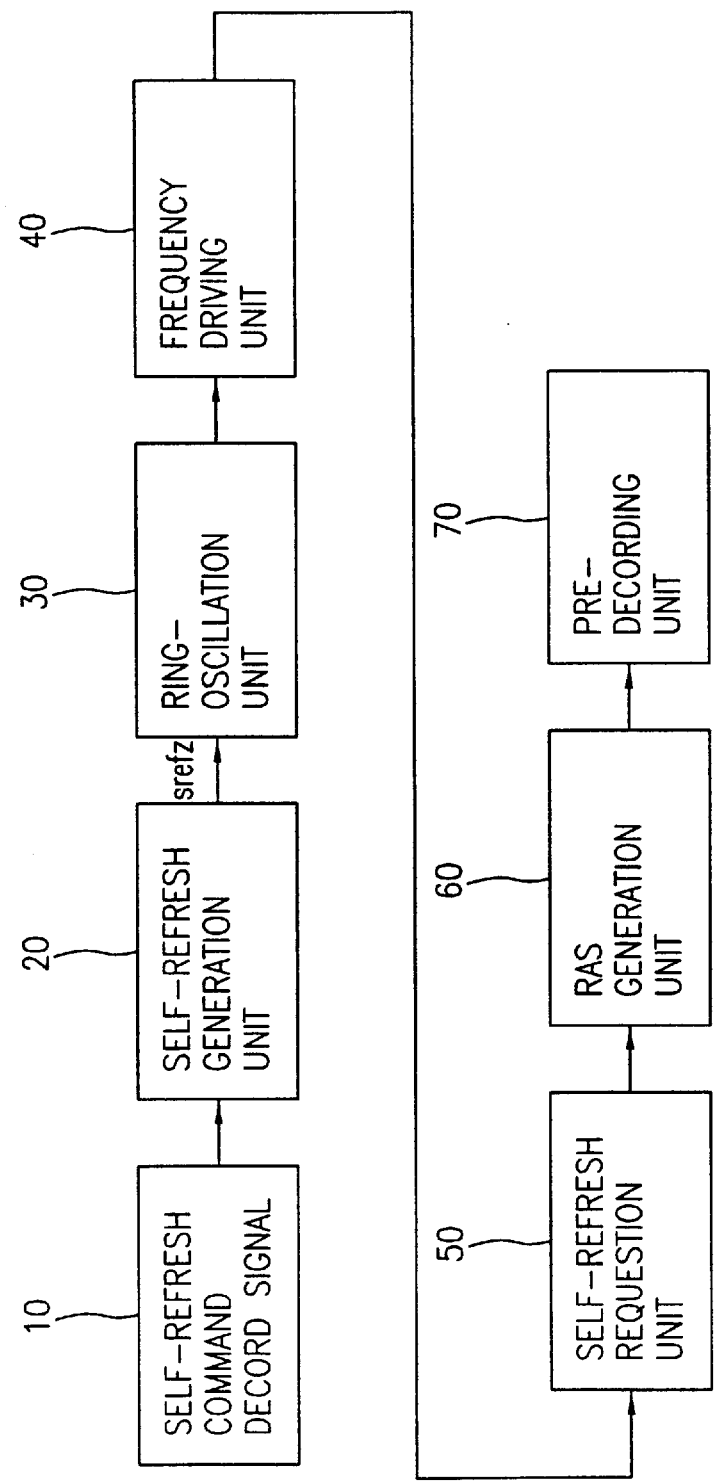
FIG. 1 is a block diagram of a conventional self refresh circuit.
Figure 2:
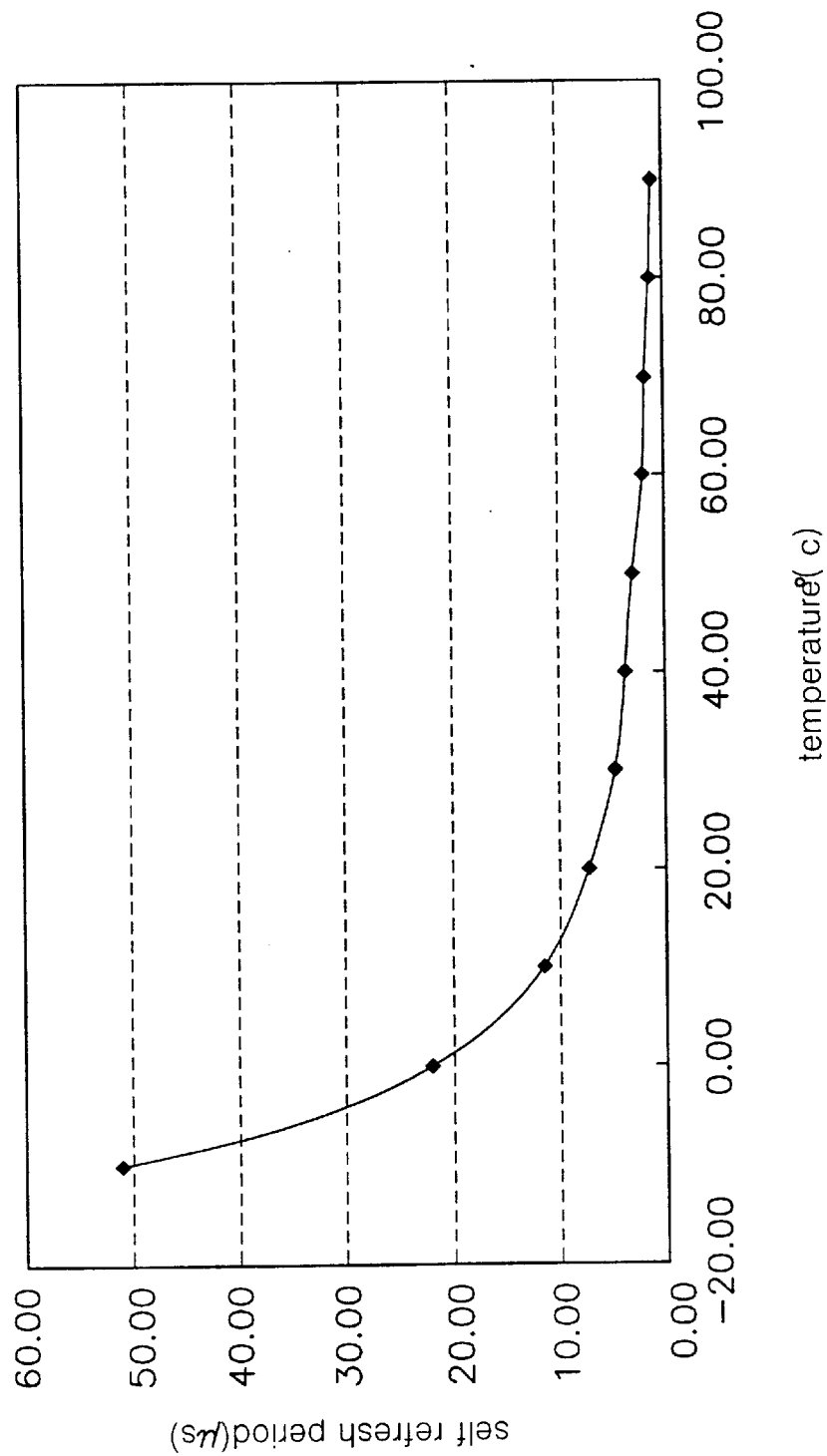
FIG. 2 is a graph showing variations of a self refresh period as a function of temperature in the conventional self refresh circuit.

A self refresh circuit for a semiconductor memory device in accordance with a preferred embodiment of the present invention will now be described with reference to the accompanying drawings. Elements having an identical or similar function are provided with the identical reference numeral, and repeated explanations thereof will be omitted.

Figure 3:
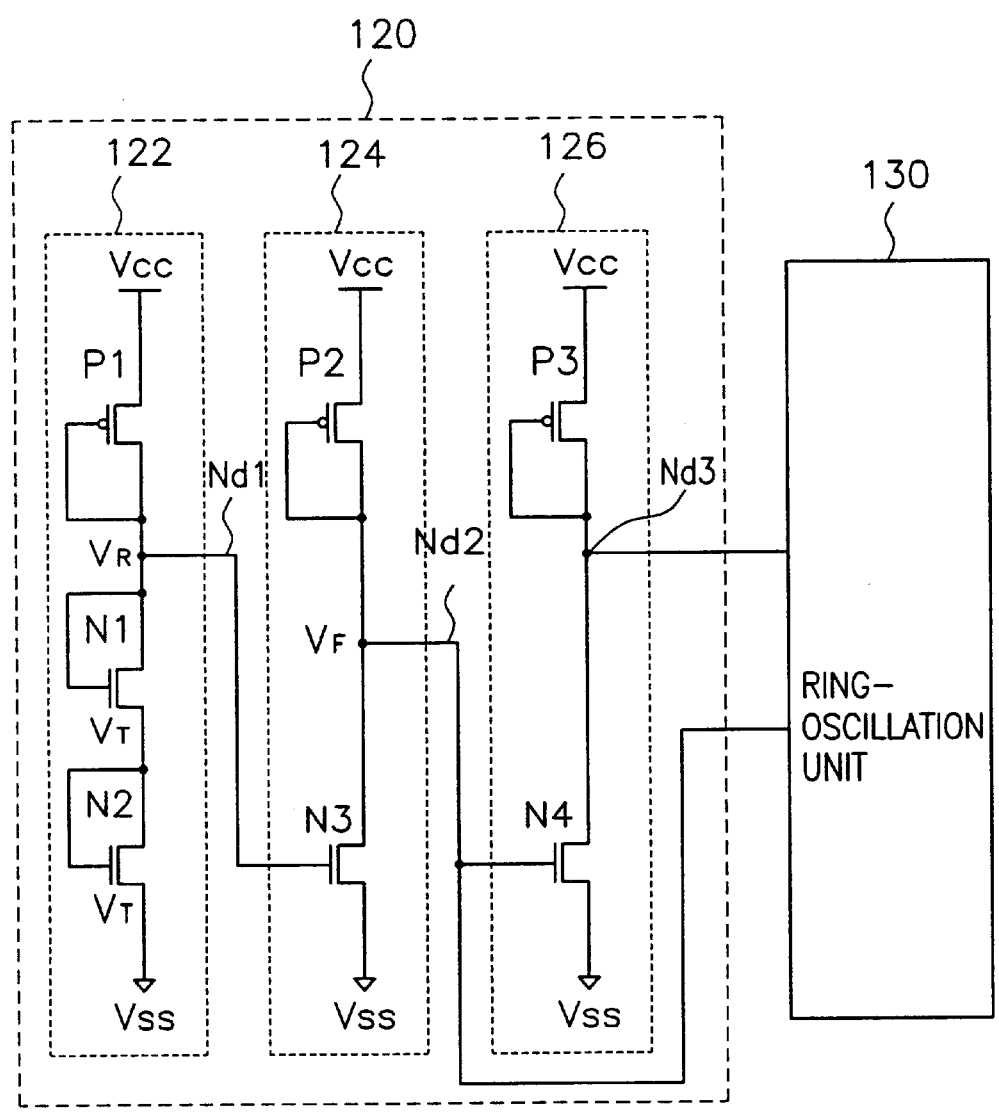
FIG. 3 is a schematic diagram of a self refresh circuit in accordance with the present invention.

FIG. 3 is a schematic diagram of a self refresh circuit in accordance with the present invention. The self refresh circuit includes a temperature sensing unit 120 for generating a bias current for adjusting a self refresh period according to a data holding time of a memory cell which is a function of temperature. A ring oscillator unit 130 generates a pulse signal having a period that is a function of temperature by virtue of the bias current from the temperature sensing unit 120.

The temperature sensing unit 120 includes a first reference voltage generating unit 122 for generating a reference voltage $V_R$ having a negative (−) property (inversely proportional) to temperature variations. A second reference voltage unit 124 receives the output signal from the first reference voltage generating unit 122, and generates a reference voltage $V_F$ having a positive (+) property (proportional) to temperature variations. A third reference voltage generating unit 126 receives the output signal $V_F$ from the second reference voltage generating unit 124, and generates an inverted signal of the signal $V_F$. The operation of the ring oscillator unit 130 is controlled according to the output signals from the second and third reference voltage generating units 124, 126.

The first reference voltage generating unit 122 includes a PMOS transistor P1 connected between a power supply voltage node Vcc and an output terminal Nd1 in a diode structure. Two NMOS transistors N1, N2 are connected in series between the output terminal Nd1 and the ground voltage node Vss in a diode structure.

In order to generate a reference voltage having a negative temperature coefficient to temperature variations, a reference voltage generating unit must operate independently of power supply voltage Vcc. Accordingly, the first reference voltage generating unit 122 obtains a double threshold voltage ($V_T$) by employing the two serially-connected NMOS transistors. The double threshold voltage $2V_T$ has a negative temperature coefficient. Therefore, the output node Nd1 is inversely proportional to the temperature variations.

The second reference voltage generating unit 124 includes a PMOS transistor P2 connected between the power supply voltage node Vcc and an output terminal Nd2 in a diode structure. An NMOS transistor N3 is connected between the output terminal Nd2 and the ground voltage node Vss, and has its gate connected to receive the output signal $V_R$ from the first reference voltage generating unit 122.

The second reference voltage generating unit 124 generates the reference voltage having a positive (+) property (proportional) to the temperature variations. The reference voltage $V_R$ from the first reference voltage generating unit 122 has the negative property and is input to the gate of the NMOS transistor N3. Thus, the ON state of the transistor is set up in a saturation region. As a result, the output node Nd2 has a linear positive property to the temperature variations.

Figure 4A:
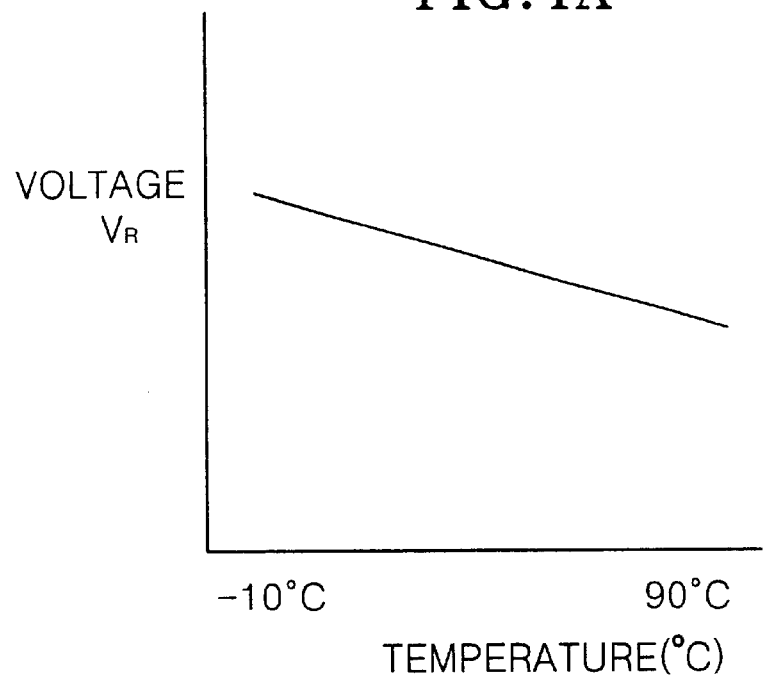
FIGS. 4a and 4b are graphs showing variations of a voltage according to a temperature in the self refresh circuit in accordance with the present invention.
Figure 4B:
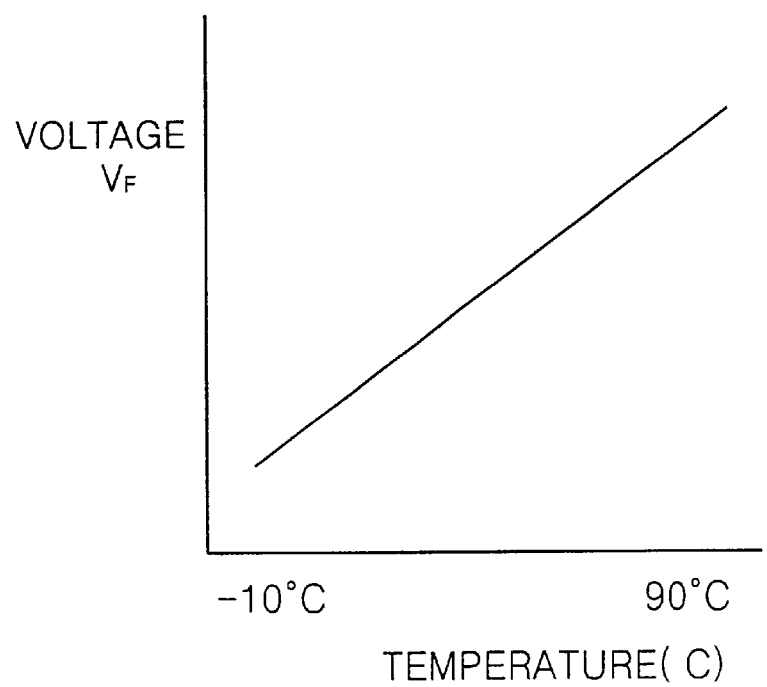

FIGS. 4a and 4b are graphs showing variations of a voltage according to the temperature in the output nodes Nd1, Nd2 of the first and second reference voltage generating units 122, 124.

FIG. 4a shows voltage variations in the output node Nd1 of the first reference voltage generating unit 122. As shown therein, when the temperature rises, the voltage $V_R$ of the output node Nd1 is reduced. That is, the first reference voltage generating unit 122 generates a reference voltage having the negative property to the temperature.

FIG. 4b shows voltage variations in the output node Nd2 of the second reference voltage generating unit 124. The voltage $V_F$ of the output node Nd2 is proportional to the temperature. That is to say, the second reference voltage generating unit 124 generates a reference voltage having the positive property to the temperature.

In addition, the third reference voltage generating unit 126 includes a PMOS transistor P3 connected between the power supply voltage node Vcc and an output terminal Nd3 in a diode structure. An NMOS transistor N4 is connected between the output terminal Nd3 and the ground voltage node Vss, and has its gate connected to receive the output signal $V_F$ from the second reference voltage generating unit 124.

The third reference voltage generating unit 126 generates an output voltage inversely proportional to the temperature. Accordingly, when the temperature is increased, the voltage of the output node Nd3 is reduced. Conversely, when the temperature is decreased, the voltage of the output node Nd3 is increased.

In general, when the temperature is increased by 10° C., the data holding time of the cell is reduced into a half. Therefore, the self refresh period must be shorter when the temperature rises. Accordingly, the operation of the ring oscillator unit 130 is controlled to generate a pulse signal having a short period, by reducing the voltage of the output node Nd3 of the third reference voltage generating unit 126.

Figure 5:
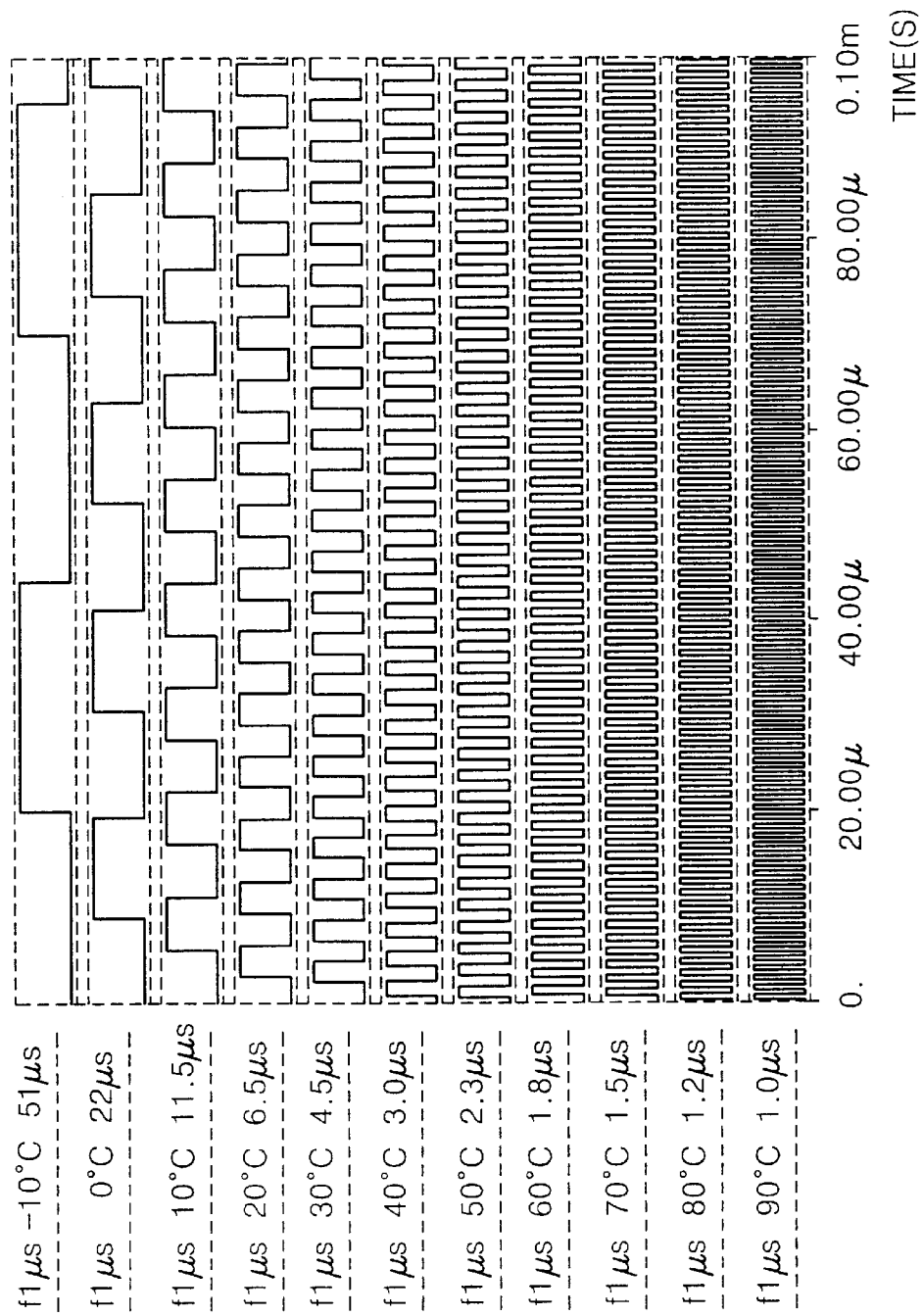
FIG. 5 is a timing diagram showing variations of a self refresh period according to a temperature in the self refresh circuit in accordance with the present invention.

FIG. 5 is a timing diagram showing variations of the self refresh period according to the temperature in the self refresh circuit in accordance with the present invention. When the temperature is varied from −10 to 90° C., the period is increased by 50 times. Even if the temperature is varied, the self refresh period can be actively varied by the temperature sensing unit 120, thereby preventing data from being lost due to the increased data holding time of the cell.

As discussed earlier, in accordance with the present invention, the self refresh circuit for the semiconductor memory device can reduce power consumption by varying the self refresh period according to the data holding time of the cell varied by the temperature.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A self refresh circuit for a semiconductor memory device, comprising:
   a temperature sensing unit for sensing a temperature, and generating a bias current for adjusting a self refresh period according to a data holding time of a memory cell that varies as a function of temperature; and
   a ring oscillator unit for generating a pulse signal having a period that is a function of the bias current from the temperature sensing unit,
   wherein the temperature sensing unit includes:
      a reference voltage generating unit for generating a reference voltage that is inversely proportional to temperature;
      an inverting unit for generating an inverted reference voltage by inverting and amplifying the reference voltage from the reference voltage generating unit; and
      a bias current generating unit for generating the bias current.

2. The circuit according to claim 1, wherein the reference voltage generating unit comprises:
   a PMOS transistor connected between a power supply voltage node and an output terminal of the reference voltage generating unit in a diode structure; and
   a plurality of NMOS transistors connected in series between the output terminal of the reference voltage generating unit and a ground voltage node in a diode structure.

3. The circuit according to claim 1, wherein the inverting unit comprises:
   a PMOS transistor connected between the power supply voltage node and an output terminal of the inverting unit in a diode structure; and
   a NMOS transistor connected between the output terminal of the inverting unit and a ground voltage node, and having its gate connected to the output terminal of the reference voltage generating unit.

4. The circuit according to claim 1, wherein the bias current generating unit comprises:
   a PMOS transistor connected between the power supply voltage node and an output terminal of the bias current generating unit in a diode structure; and
   a NMOS transistor connected between the output terminal of the bias current generating unit and a ground voltage node, and having its gate connected to the output terminal of the inverting unit.

* * * * *